(12) United States Patent  
Jacobson

(10) Patent No.: US 6,195,774 B1
(45) Date of Patent: Feb. 27, 2001

(54) BOUNDARY-SCAN METHOD USING OBJECT-ORIENTED PROGRAMMING LANGUAGE

(75) Inventor: Neil G. Jacobson, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/134,077

(22) Filed: Aug. 13, 1998

(51) Int. Cl.[7] .................................................. G01R 31/28
(52) U.S. Cl. ........................................... 714/727; 714/725
(58) Field of Search .................................. 714/727, 726, 714/725, 724, 25

(56) References Cited

U.S. PATENT DOCUMENTS

| | | | |
|---|---|---|---|
| 5,487,134 | * | 1/1996 | Ballard .................................... 395/51 |
| 5,544,308 | * | 8/1996 | Giordano et al. ................ 395/183.02 |
| 5,737,497 | * | 4/1998 | Ballard .................................... 395/50 |
| 5,841,867 | * | 11/1998 | Jacobson et al. ....................... 380/25 |
| 6,035,106 | * | 3/2000 | Carruthers et al. ............. 395/500.01 |
| 6,074,432 | * | 6/2000 | Guccione ................................. 717/2 |
| 6,078,736 | * | 6/2000 | Guccione ........................ 395/500.17 |
| 6,120,549 | * | 9/2000 | Goslin et al. .......................... 703/20 |

OTHER PUBLICATIONS

Dey and Potkonjak, "Transforming behavioral specifications to facilitate synthesis of testable designs", Proceedings of the 1994 International Test Conference, Oct. 2–6, 1994, pp. 184–193.*

Higami, Kajihara, and Kinoshita, "A partial scan algorithm based on reduced scan shift", Proceedings of the Third Asian Test Symposium, Nov. 15–17, 1994, pp. 336–341.*

* cited by examiner

Primary Examiner—Albert De Cady
Assistant Examiner—Samuel Lin
(74) Attorney, Agent, or Firm—Bever, Hoffman & Harms, LLP; Patrick T. Bever; Lois D. Cartier

(57) ABSTRACT

A Java-based method for performing Boundary-Scan Test procedures on an IEEE Standard 1149.1 compliant integrated circuit device. A Boundary-Scan Test application procedural interface (BST API) is provided that includes several objects defining the Boundary-Scan architecture of IEEE Standard 1149.1 compliant integrated circuit devices, and defines a plurality of Java-based source code commands utilized in applets for performing Boundary-Scan Test procedures. To facilitate implementing a single applet on a wide variety of hardware platforms, the BST API is based on a command structure subset implemented by a wide range of available Java flavors.

9 Claims, 9 Drawing Sheets

BOUNDARY-SCAN METHOD USING OBJECT-ORIENTED PROGRAMMING LANGUAGE

FIELD OF THE INVENTION

The present invention relates to integrated circuit devices (ICs), and more particularly to a boundary-scan method for use during in-system programming and test of an IC.

BACKGROUND OF THE INVENTION

Programmable Logic Devices (PLDs) are Integrated Circuits (ICs) that are user configurable and capable of implementing digital logic functions. There are several types of PLDS, including Field Programmable Gate Arrays (FPGAs) and Complex Programmable Logic Devices (CPLDs). CPLDs typically include several function blocks that are based on the well-known programmable logic array (PLA) architecture, and include a central interconnect matrix to transmit signals between the function blocks. Both the logic performed by the function blocks and the signal paths implemented by the interconnect matrix are controlled by configuration data stored in a configuration memory of the CPLD. FPGAs include configurable logic blocks (CLBs) arranged in rows and columns, and programmable interconnect lines that extend between the rows and columns of CLBs. Each CLB includes look-up tables and other configurable circuitry that is programmable to implement a portion of a larger logic function. Both the CLBs and interconnect lines are controlled by configuration data stored in a configuration memory of the FPGA.

PLDs are programmed (configured) using data generated by place-and-route software. The PLD programming process typically begins after the user enters his/her logic operation into a computer/workstation in which the place-and-route software is installed. The user then identifies a target PLD architecture and instructs the place-and-route software to generate configuration data which, when entered into the configuration data of the target PLD, programs the target PLD to implement the logic operation. The place-and-route software begins this process by accessing a stored description of the target PLD and the logic operation entered by the user. The place-and-route software then divides the logic operation into inter-related logic portions that can be implemented in the individual function blocks/CLBs of the target PLD, as identified in the PLD description. The place-and-route software then "places" (assigns) the logic portions to specific function blocks/CLBs associated with the target PLD. Routing data is then generated by identifying specific interconnect resources of the target PLD that can be linked to form the necessary signal paths between the inter-related logic portions assigned to the function blocks/CLBs. The placement and routing data is then combined to form configuration data that is converted into a bit map file that, when transmitted into the configuration memory of the target PLD, causes the target PLD to implement the logic function.

PLDs have become popular for implementing various functions in electronic systems that, in the recent past, were typically implemented by smaller (<100,000 gates) application specific integrated circuits (ASICs). Such functions include glue logic, state machines, data bus logic, digital signal processors and protocol devices. Early PLDs often provided insufficient capacity to implement these functions, so the significant investment of time and money to design, layout and fabricate an ASIC for these functions was justified. However, recent advances in semiconductor and PLD technologies have produced PLDs with the necessary speed and capacity to implement these functions in most applications. Because PLDs are relatively inexpensive and can be programmed in as little time as a few seconds, the expense associated with the design, layout and fabrication of ASICs became harder to justify. Further, the reprogrammability of many PLDs makes them even more attractive than ASICs because it is possible to update (reconfigure) PLDs, whereas ASICs must be replaced. As such, there is a trend toward the use of PLDs in place of ASICS in electronic systems.

Most electronic systems include multiple ICs (such as PLDS, ASICs, memory devices and processors) mounted on a printed circuit board (PCB). Each PCB includes a pattern of printed metal lines (e.g., copper tracks) formed on a board of insulating material. The ICs are typically soldered to the copper tracks at specific locations on the PCB so that the copper tracks provide signal paths between the ICs that are necessary to form the desired electronic system.

After ICs are soldered to a PCB to form an electronic system, the system is typically tested to verify that all of the ICs are properly mounted (e.g., that the copper tracks provide all required IC-to-IC connections). Early electronic systems were tested using mechanical probes (e.g., bed-of-nails fixtures) that contacted the copper tracks of the PCBs and generated test signals for verifying the interconnections between the ICs. However, steady advances in semiconductor technologies have provided highly integrated ICs mounted in packages that have hundreds of contact points (e.g., pins) arranged at very small pitches. Further, trends toward smaller products have forced manufacturers to pack ICs more densely on PCBs. As a result, conventional PCB testing methods using mechanical probes (e.g., bed-of-nails fixtures) are greatly impeded for several reasons. First, to support these highly integrated ICs, modern PCBs must be formed with copper tracks having ever-narrower widths, thereby making conventional testing difficult because test nails having very small physical dimensions are required. Second, the increase in the number of device contact points requires an increase in the number of copper tracks per PCB, thereby requiring test equipment that is increasingly more expensive to purchase and operate. Third, the dense packing of ICs on each PCB leaves little room for probe contact. Moreover, recent PCB technologies in which surface mounted IC devices are mounted on both sides of each PCB make mechanical probing practically impossible because of the required simultaneous probe contact on both sides of a PCB.

IEEE Standard 1149.1 (Boundary-Scan) was developed to overcome the limitations of conventional mechanical PCB probe testing. IEEE Standard 1149.1 defines a four pin serial interface that drives a 16-state controller (state machine) formed in each compliant IC device. The four pins control transitions of the state machine and facilitate loading of instructions and data into the compliant IC device to accomplish pre-defined tasks. Originally, IEEE Standard 1149.1 was developed to perform Boundary-Scan Test procedures wherein the interconnections and IC device placement on PCBs are tested through the connection pins of the PCBs (i.e., without the need for a mechanical probe). Since its establishment, some implementations of Boundary-Scan have been extended to include additional test procedures such as device functional tests, self-tests and diagnostics. More recently, Boundary-Scan has been modified to provide In-System Programming, whereby configuration data is transmitted into a target PLD after the PLD is mounted onto a PCB.

FIG. 1 shows a simplified electronic system provided for the purpose of explaining the basic concepts of Boundary- Scan Test procedures. The simplified electronic system is formed on a PCB 100 and includes a first IC 110 and a second IC 120.

PCB 100 includes copper traces formed on a board of insulating material that provide signal paths between a PCB connector 101 and ICs 110 and 120, and between ICs 110 and 120. In addition to the copper traces that transmit normal operation signals (not shown), PCB 100 includes four traces for transmitting Boundary-Scan Test signals. These copper traces include a first trace 102 for transmitting test data-in (TDI) signals, a second trace 103 for transmitting test data-out (TDO) signals, a third trace 104 for transmitting test clock (TCK) signals, and a fourth trace 105 for transmitting test mode select (TMS) signals. Boundary-Scan data (TDI/TDO) signals are typically transmitted serially through each compliant device of a system. That is, TDI signals are transmitted on first trace 102 to first IC 110, TDO signals are transmitted from IC 110 and received as TDI signals by second IC 120 along a linking trace 106, and TDO signals are transmitted from IC 120 to PCB connector 101 on second trace 103. In contrast to the data signals, each compliant device receives the TCK and TMS signals in a parallel manner.

Each IC of an electronic system typically includes input and output terminals and core logic circuitry located between the input and output terminals. For example, first IC 110 includes input terminals 112 that transmit input signals via lines 114 through respective buffers to core logic 115, which in turn transmits output signals on lines 116 to output terminals 118 via respective buffers. Similarly, second IC 120 includes input terminals 122 that transmit input signals via lines 124 to core logic 125, which in turn transmits output signals on lines 126 to output terminals 128. Core logic 115 and 125 include, for example, the logic circuitry associated with an ASIC, or the programmable interconnect and logic circuitry associated with a PLD.

In addition to core logic and input/output circuitry, each IC device that complies with IEEE Standard 1149.1 includes dedicated pins and hardware elements (referred to below as the Boundary-Scan architecture) for implementing Boundary-Scan Test procedures.

The pins of the Boundary-Scan Test architecture are typically identical to other "normal" pins of an IC. Referring to FIG. 1, first IC 110 includes four pins 142(1) through 142(4) that are respectively connected to trace 102 (TDI), trace 105 (TMS), trace 104 (TCK) and trace 106 (TDO). Similarly, second IC 120 includes four pins 142(5) through 142(8) that are respectively connected to trace 106 (TDI), trace 104 (TCK), trace 105 (TMS) and trace 103 (TDO).

The data and test control circuitry of the Boundary-Scan architecture provided on each compliant device utilize the signals received on the four dedicated pins. Briefly described, the data circuitry of the Boundary-Scan architecture includes a series of data registers, each register associated with one of the input and output pins of the device, and the test control circuitry controls the operation of these registers. For example, the signal received at the TDI pin 142(1) is serially transmitted on a line 144 through a series of data registers 146 to TDO pin 142(4). Each data register 146 is connected to an input pin 112 or an output pin 118 of first IC 110. A similar Boundary-Scan architecture is provided on second IC 120. Test control circuitry 148(1) (which is described in additional detail below) is controlled by control signals transmitted on the TDI/TDO line, the TCK and TMS signals to direct data signal shifting through data registers 146 to facilitate Boundary-Scan Testing of first IC 110. Similar test control circuitry 148(2) is provided on second IC 120.

An example illustrating the operation of the Boundary-Scan architecture will now be described. To verify the connection between first IC 110 and second IC 120 on copper trace 108, test control circuitry 148(1) receives instructions to shift a first data value into a first data register 142(1) on first IC 110. At the same time, test control circuitry 148(2) on second IC 120 is instructed to shift a second data value into a second data register 146(2). Test control circuits 148(1) and 148(2) are then controlled to transmit the data value from first data register 146(1) and receive the data value in second data register 146(2) on trace 108. The data value stored in second data register 146(2) is then shifted out from second IC 120. If the shifted-out data value equals the first data value, then the connection between first IC 110 and second IC 120 on trace 108 is verified.

The simple example provided above illustrates how the Boundary-Scan architecture is utilized to perform a basic Boundary-Scan Test. As described in additional detail below, the Boundary-Scan architecture is particularly useful for performing diagnostic procedures and In-System Programming in IEEE Standard 1149.1 compliant PLDs.

In-System Programming (hereafter ISP) is made possible by recent advances in PLD technology that allow both programming and operation at system voltages (i.e., 3.3V or 5V). Before PLDs with system-level programming voltages were available, programming voltages of 12V or more were required, thereby limiting PLD programming to situations in which this high programming voltage was available. This often-required users to program their PLDs before mounting them onto system PCBs, thereby increasing the risk of handling fallout due to leads that were bent or broken during transportation. ISP reduces PLD handling fallout because it reduces the amount of handling required during programming and system installation.

ISP is also a powerful tool because it facilitates complete life cycle system development, test, debug and upgrade of systems incorporating IEEE Standard 1149.1 compliant PLDs that support ISP (hereafter "ISP compliant PLDs". That is, after assembly onto a system PCB, the software used to program ISP compliant PLDs can be developed and debugged during the system prototype development phase, programmed into large numbers of PLDs during manufacturing, and debugged (even remotely) in the field as part of maintenance operations. Further, because of ISP, a system can be upgraded virtually anywhere the system is located by reconfiguring (reprogramming) the systems ISP compliant PLDs.

A current problem with systems incorporating ISP compliant PLDs is that programming commands must be written in several software languages for each of the programming platforms utilized during the prototype, production and maintenance/upgrade phases of the system's product lifetime. For example, product development is typically performed by programming PLDs using special development software run on a PC or workstation. After development, mass production typically involves programming using large, high-speed sophisticated systems such as HP3070 automatic test equipment available from Hewlett Packard. Finally, when testing or reprogramming is done in the field, ISP is often performed by relatively simple platforms, such as hand-held diagnostic equipment using 8051 processors. Typically, three or more sets of programming commands are required for each of these platforms: a first set for the PC/workstation development platform, a second set for the mass production platform, and a third set for in-the-field test/reprogramming platform. As is well known in the art, the translation of such programming commands typically results in errors that can cause the system to malfunction.

Similar problems arise with respect to the translation of Boundary-Scan Test commands generated for ASICs and other ICs. That is, a Boundary-Scan Test procedure written for a first hardware platform (e.g., a PC or workstation) often must be translated before it can be utilized in a second hardware platform (e.g., field test equipment).

What is needed is method for generating ISP and other Boundary-Scan Test instructions for ISP compliant PLDs and ICs that can be implemented on any platform, thereby avoiding costly translation of the Boundary-Scan and ISP instructions into several languages and the potential problems associated with mistranslation.

SUMMARY OF THE INVENTION

The present invention provides a method for generating ISP and Boundary-Scan Test instructions for IEEE Standard 1149.1 compliant PLDs that can be implemented on any of several possible platforms, thereby avoiding costly translation of the instructions into several languages and the potential problems associated with mistranslation.

The method comprises generating a Boundary-Scan Test application procedural interface (BST API) including one or more objects that define the architecture of the IEEE Standard 1149.1 compliant PLDs, and a plurality of source code commands using an object oriented, platform independent programming language. The objects and source code commands are defined using basic command structures of the object oriented, platform independent programming language such that the BST API operates on any hardware platform.

In accordance with a first aspect of the present invention, the API is written using the Java programming language, developed by Sun Microsystems, Inc. In one embodiment, the API includes command structures that can be implemented in any flavor of Java, thereby assuring that the BST and ISP procedures generated using the methods defined in the BST API will run on all potential hardware platforms.

In accordance with a second aspect of the present invention, Boundary-Scan Test procedures including selected source code commands defined in the BST API are generated in which the selected source code commands of the Boundary-Scan Test procedure are executable on any of the plurality of hardware platforms. In one embodiment, the Boundary-Scan Test procedure is generated as a Java language applet ("Scanlet" including the selected source code commands of the BST API. Because the Scanlets are generated using the methods defined in the BST API, a user is able to specify the precise BST/ISP procedures to be performed. However, because the BST API restricts calls to the native interface to objects that are not used to generate the Scanlets, the user is able to concentrate on the particular BST/ISP procedure to be performed, not on the specific hardware platform utilized to perform the BST/ISP procedure. In another embodiment, the step of generating the Boundary-Scan Test procedure includes generating an object with pre-defined methods that are instantiated in a master applet. When executed on a selected platform, this master applet presents pre-defined procedures that can be interactively called by a user, thereby allowing the user to perform selected Boundary-Scan Test procedures on a target IEEE Standard 1149.1 compliant PLD without requiring a detailed knowledge of the BST API.

In accordance with another aspect of the present invention, the BST API includes an object that defines the sixteen states associated with the Boundary-Scan TAP-Controller state machine of the target IEEE Standard 1149.1 compliant PLD. This simplifies the formation of BST/ISP procedures because it allows the user to identify a state change in the state machine simply by identifying a desired state. All signals necessary to transition the state machine to the desired state are pre-defined by methods provided in another object of the BST API.

In accordance with another aspect of the present invention, the BST API includes an object that includes a standard data interface, thereby allowing the user to define utilize a selected data compression algorithm.

DETAILED DESCRIPTION OF THE DRAWINGS

Figure 1:
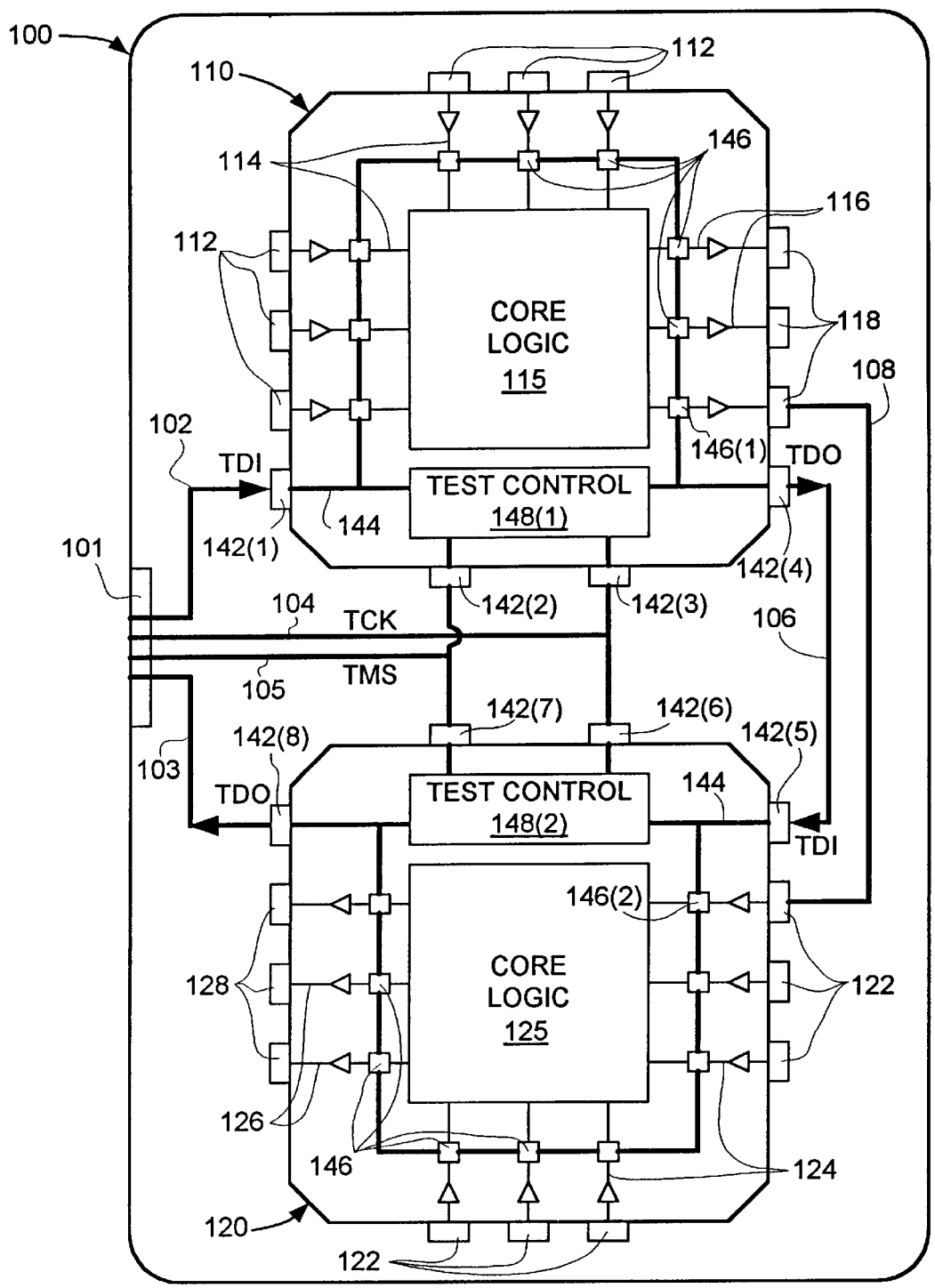
FIG. 1 is a simplified diagram showing an electronic system incorporating IEEE Standard 1149.1 compliant ICs.

The present invention is directed to Boundary-Scan Test procedures for systems implementing IEEE Standard 1149.1 compliant ICs, and particularly to methods for implementing Boundary-Scan Test procedures for systems implementing ISP compliant PLDs, such as that shown in FIG. 1. Although the method for generating Boundary-Scan Test procedures according to the present invention is described below with particular reference to ISP compliant PLDs, the disclosed method may be beneficially utilized to perform other Boundary-Scan Test procedures for systems incorporating other IEEE Standard 1149.1 compliant ICs.

System Overview

Figure 2:
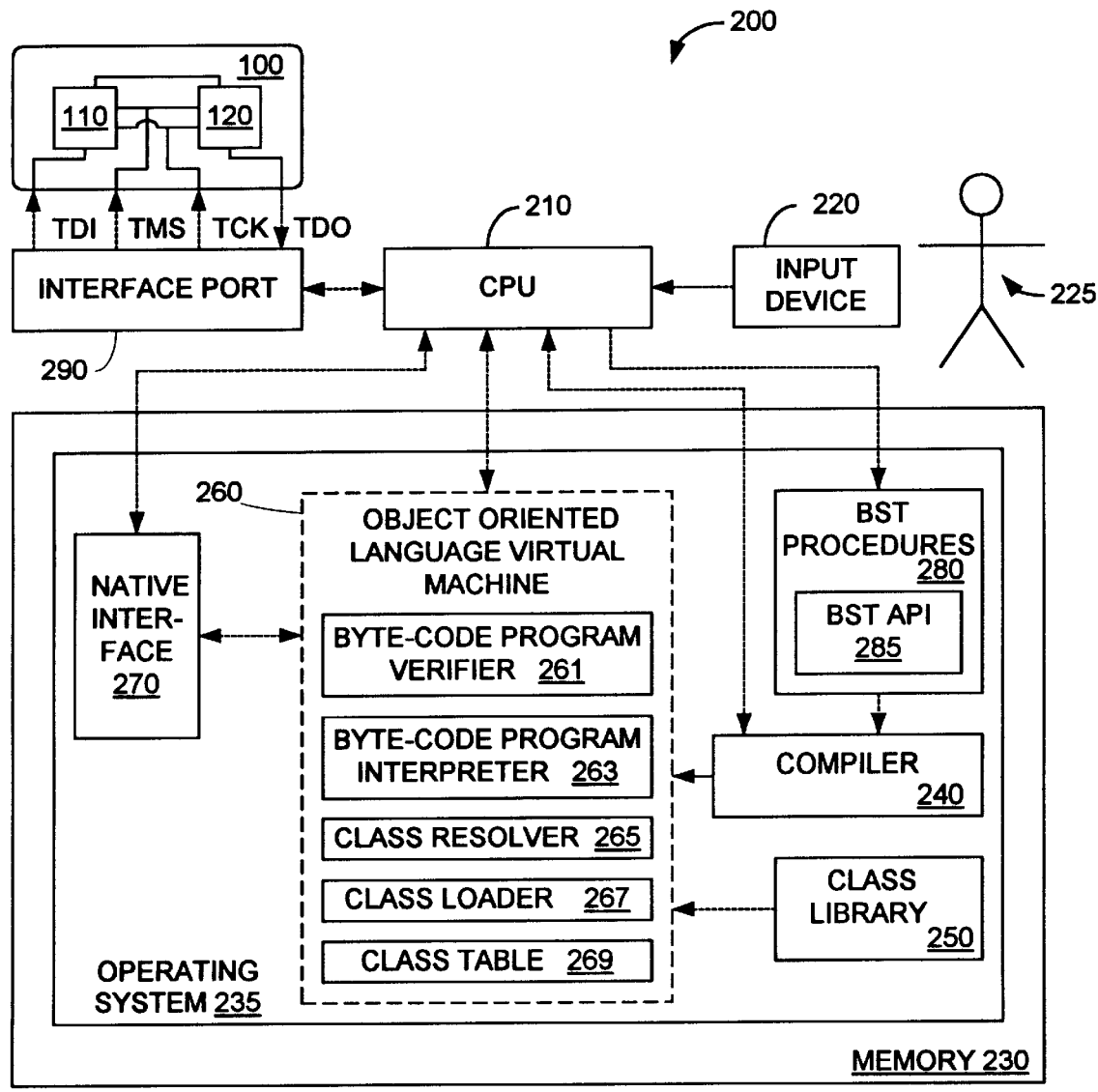
FIG. 2 is a block diagram showing a system utilized by the method according to the present invention

FIG. 2 shows a block diagram generally illustrating a system 200 utilized to perform Boundary-Scan Test procedures in accordance with an embodiment of the present invention. System 200 includes a CPU 210 that receives data and instructions through an input device 220 from a user 225. CPU 210 operates in association with a memory 230 that stores an operating system 235. Several software tools (programs) are available to CPU 210 through operating system 235. These software tools are directed to an object oriented programming language, such as the Java programming language developed by Sun Microsystems, Inc., and include a compiler 240, a class library 250, an object oriented programming language virtual machine 260 and a native interface 270. In addition, a portion of memory 230 is utilized to receive and store Boundary-Scan Test (BST) procedures 280 that incorporates the Boundary-Scan Test application procedure interface (BST API) 285 in accordance with the present invention. Boundary-Scan Test signals are processed by virtual machine 260 in response to instructions and data provided in the procedures 280, and are transmitted to and from a target electronic system via native interface 270 and an interface port 290.

In one embodiment, the operating system 235 is an object-oriented multitasking operating system that supports multiple threads of execution within each defined address space. In this embodiment, system 200 is a Sun Microsystems SPARC Workstation, CPU 210 is a SPARC microprocessor, and operating system 235 is a Solaris operating system. However, the present invention is specifically constructed to be equally applicable to computer systems using a wide variety of hardware and operating system platforms.

The Boundary-Scan Test method begins when user 225 enters BST procedures 280 into memory 230 via an input device 220 (for example, a keyboard, mouse or a floppy disk drive). A preliminary point that should be understood is that procedures 280 generally includes "programs" (i.e., methods) that are written in Java source code and in accordance with parameters established by BST API 285. Compiler 240 then compiles procedures 280 into a byte-code language format that can be implemented by virtual machine 260.

When BST procedures 280 are formed using Java source code, the software tools utilized by the system shown in FIG. 2 are implemented by Java-based products. Specifically, compiler 240 is implemented by a Java compiler, class library 250 is implemented by a Java class library, virtual machine 260 is implemented by a Java virtual machine, and native interface 270 is implemented by a Java native interface.

Java compiler 240 includes the procedures for building a class file that holds all the compiled methods of BST procedures 280. Java compiler 240 does not generate machine dependent code, sometimes known as object code or relocatable object code. Rather, the output of Java compiler 240 is a Java byte-code language method that is platform independent. Therefore, Java byte-code language methods (usually called Java programs or Java methods) can be executed on any computer that has a Java virtual machine.

Java virtual machine 260 generally includes a Java byte-code program verifier 261, a Java byte-code program interpreter 263, a class resolver 265, a class loader 267 and a loaded class table 269. Java byte-code program verifier 261 verifies whether or not the byte-code programs of procedures 280, which are generated by Java compiler 240, satisfy certain predefined integrity criteria. Java byte-code program interpreter 263 executes these Java byte-code programs. Java class resolver 265 dynamically links methods during execution of the byte-code programs, including determining if an invoked method is already loaded with procedures 280, and calling class loader 267 if the invoked method is not already loaded. Java class loader 267, loads object classes from procedures 280 and, if necessary, from Java class library 250 and utilizes byte-code program verifier 261 to verify the integrity of the methods associated with each loaded object class.

Java native interface 270 includes programs written in the object code for the underlying computer hardware (e.g., CPU 210 and interface port 290) that are invoked by Java methods. The instructions and data (i.e., Boundary-Scan Test signals TDI, TMS and TCK) generated by Java virtual machine 260 in accordance with BST procedures 280 are transmitted via Java native interface 270 and CPU 210 to interface port 290. From interface port 290, these signals are transmitted to a target electronic system (shown generally as including PCB 100 and ICs 110 and 120, see also FIG. 1). Test result signals (i.e., Boundary-Scan Test signals TDO) that are generated by the target electronic system in response to the instructions and data are transmitted back through interface port 290, CPU 210 and Java native interface 270 (if necessary) to Java virtual machine 260 for analysis.

Boundary-Scan Overview

The following paragraphs provide an overview of the relevant hardware associated with an ISP compliant PLD for purposes of illustrating an embodiment of the present invention.

Figure 3:
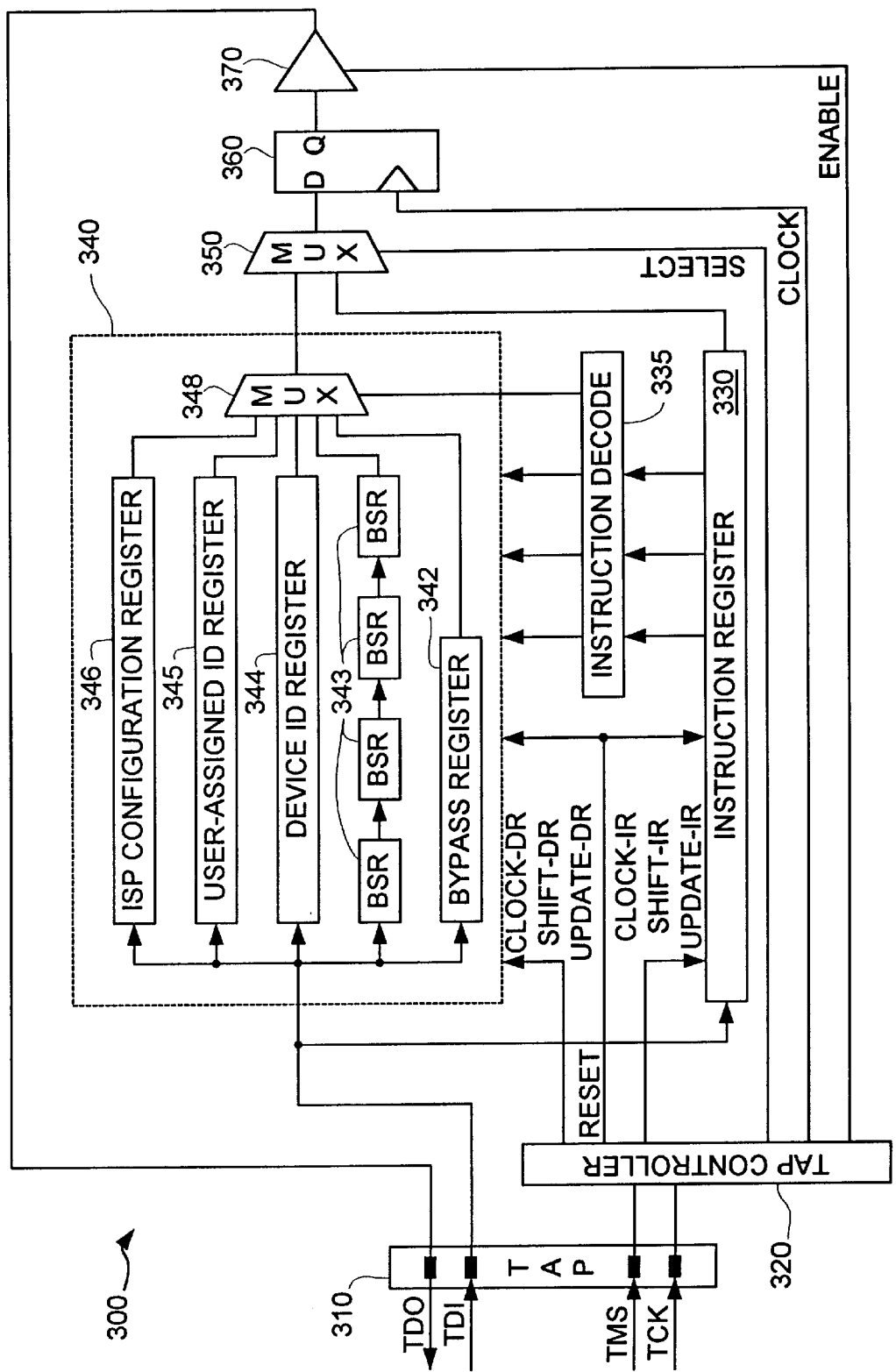
FIG. 3 is a diagram showing a Boundary-Scan architecture of an ISP compliant PLD.

FIG. 3 is a block diagram showing an example of the basic hardware elements provided on an ISP compliant PLD. The basic hardware elements include a test access port (TAP) 310, a TAP controller 320, an instruction register (IR) 330, an instruction decode circuit 335, a test data register circuit 340, an output multiplexer (MUX) 350, an output flip-flop 360 and a tri-state buffer 370.

TAP 310 provides access to the test support functions build into an ISP compliant PLD. TAP 310 includes three input connections for receiving the test clock input (TCK) signal, the test mode select (TMS) signal, and the test data input (TDI) signal. The TCK signal allows the Boundary-Scan architecture to operate independently from the built-in system clock provided on the PLD. The TMS signal is used to control the state of TAP controller 320, as discussed below. The TDI signal is used for serial transmission of data or instruction bits, depending upon the state of TAP controller 320. TAP 310 may also include an optional fourth input terminal for receiving a test reset input signal for asynchronous resetting of TAP controller 320. In addition to the above-mentioned input connections, TAP 310 includes an output connection through which the TDO signals are transmitted. Depending upon the state of TAP controller 320, the TDO signal is used to serially shift either instruction register or data register contents out of the PLD.

Figure 4:
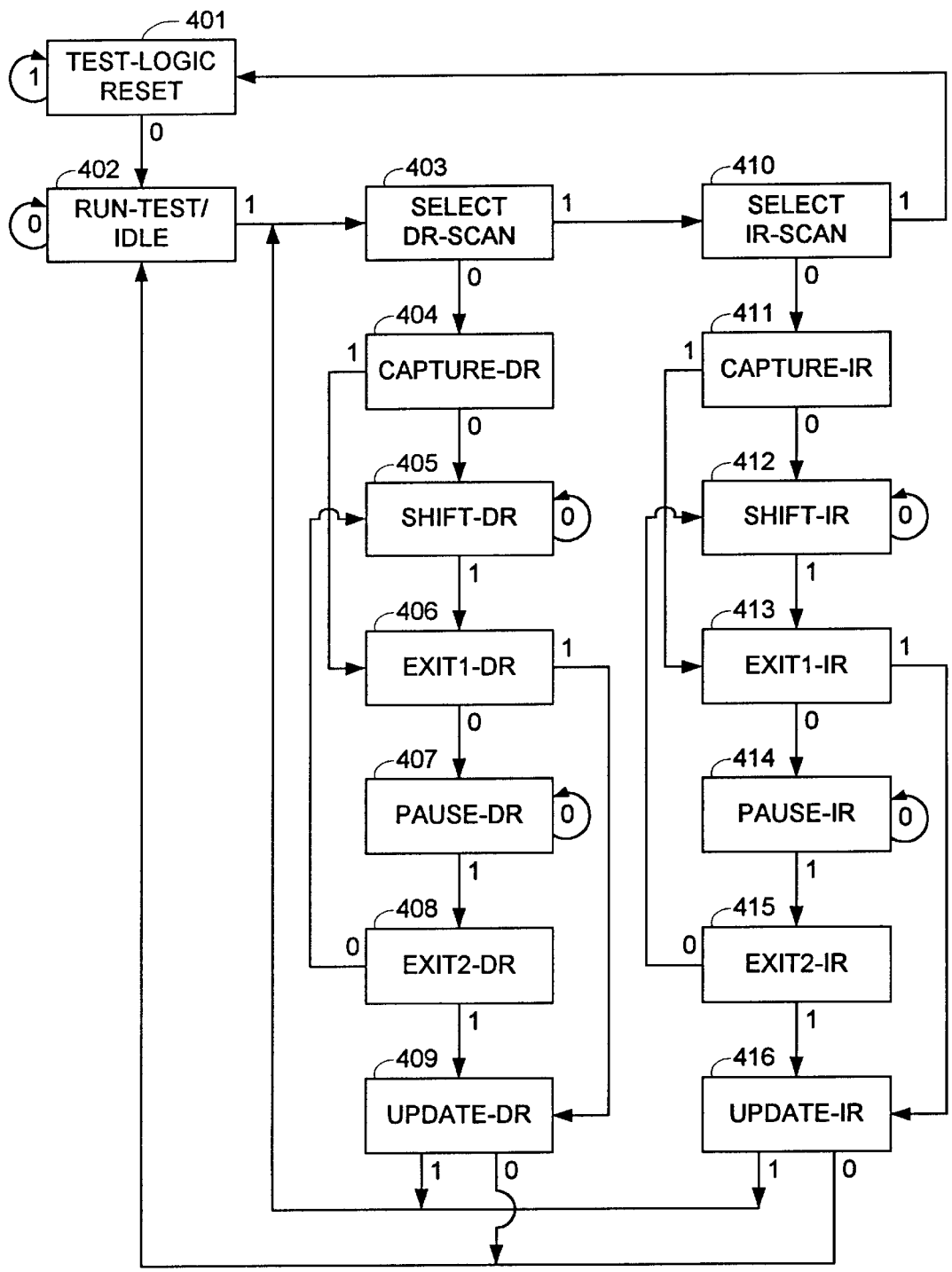
FIG. 4 is a block diagram showing the various states of a state machine associated with the Boundary-Scan architecture.

FIG. 4 is a state diagram for explaining the operation of TAP controller 320 (shown in FIG. 3). The basic function of TAP controller 320 is to generate clock and control signals required for the correct sequence of operations of instruction register 330, test data register circuit 340, output MUX 350, output flip-flop 360 and tri-state buffer 370. Specifically, TAP controller 320 control signals that facilitate loading of instructions into instruction register 330, shifting TDI data into and TDO data out of the data registers in test data register circuit 340, and performing test actions such as capture, shift and update test data. These signals are provided in accordance with the state of TAP controller 320. All state transitions (indicated as arrows in FIG. 4) within TAP controller 320 occur in accordance with the serially received TMS values (shown next to each arrow).

TAP controller 320 is initialized to a Test-Logic Reset state 401 at power up. In this state all test logic is disabled (i.e., all core logic of the PLD operates normally). TAP controller 320 will enter Test-Logic Reset state 401 from any other state when TMS is held high (logic 1) for at least five TCK pulses.

From Test-Logic Reset state 401, TAP controller 320 enters a Run-Test/Idle state 402 when TMS is held low (logic 0) for at least one TCK pulse. TAP controller 320 is placed in this state while, for example, self-test or data scan operations are performed, and remains in this state until TMS is held high.

During test procedures, TAP controller 320 either enters a '-DR' branch of the state machine (i.e., states 403 through 409), or a '-IR' branch of the state machine (i.e., states 410 through 416). From Run-Test/Idle state 402 TAP controller 320 enters the '-DR' branch when TMS is held high (logic 1) for one TCK pulse, then held low (logic zero), thereby respectively shifting to a Select DR-Scan state 403, and then to a Capture-DR state 404. Alternately, from Run-Test/Idle state 402 TAP controller 320 enters the '-IR' branch when TMS is high (logic 1) for two TCK pulses, then low (logic zero), thereby respectively shifting through Select DR-Scan state 403 to Select IR-Scan state 410, and then to a Capture-IR state 411.

When TAP controller 320 enters the '-DR' branch of the state diagram, a selected data register (or serially connected set of registers) of test data register circuit 340 is connected between TDI and TDO (see FIG. 3). Capture-DR state 404 is used to load data from, for example, an input pin of the PLD. From Capture-DR state 404, TAP controller 320 enters an Exit1-DR state 406 when TMS is held high, or enters a Shift-DR state 405 when TMS is held low. Shift-DR state 405 is used to shift previously captured data toward the TDO connector such that the data is shifted by one serially connected register per TCK pulse. TAP controller 320 remains in Shift-DR state 405 as long as TMS remains low, and enters Exit1-DR state 406 when TMS is subsequently held high. From Exit1-DR state 406, TAP controller 320 enters either a Pause-DR state 407 when TMS is held low, or enters an Update-DR state 409 when TMS is held high. Pause-DR state 407 is provided to temporarily halt a shifting process to allow, for example, synchronization between TCK and system clock signals, when needed. TAP controller 320 remains in Pause-DR state 407 until TMS is held high, at which time it enters Exit2-DR state 408. From Exit2-DR state 408, TAP controller 320 either returns to Shift-DR state 405 when TMS is held low, or enters Update-DR state 409 when TMS is held high. Once TAP controller 320 is in Update-DR state 409, data shifting to/between the selected register(s) is completed, and the data stored in the selected register(s) is passed, for example, to the output pins of the PLD. From Update-DR state 409, TAP controller 320 either returns to Run-Test/Idle state 402 when TMS is held low, or to Select-DR state 403 when TMS is held high.

In contrast to the '-DR' branch, instruction register 330 is connected between TDI and TDO when TAP controller 320 enters the '-IR' branch (states 410 through 416) of the state diagram. The '-IR' branch is used to load instructions that are used, for example, to select a data register (or serially-connected set of registers) of test data register circuit 340 for subsequent test data operations. As can be observed in FIG. 4, states 410 through 416 of the '-IR' branch are respectively similar to states 403 through 409 of the '-DR' branch, and provide similar functions with respect to instruction register 330. Therefore, these states will not be discussed in further detail.

Referring again to FIG. 3, instruction register 330 receives and stores test instructions transmitted to the PLD. When TAP controller 320 is in Shift-IR state 412 (see FIG. 4), a series of instruction registers are connected in series between the TDI and TDO connectors. The test instruction data subsequently shifted into the instruction registers defines the test data register to be addressed and the test to be performed.

Figure 5:
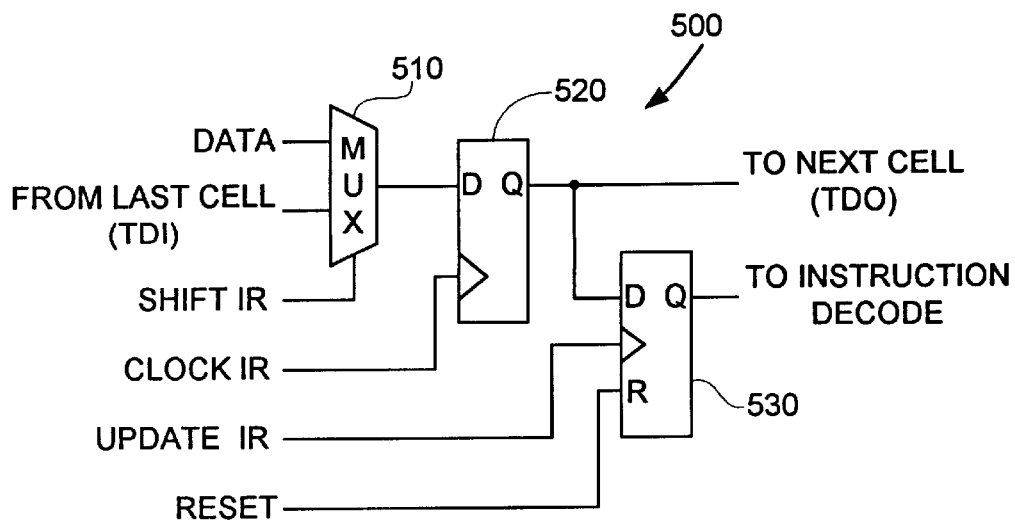
FIG. 5 is a simplified schematic diagram showing an instruction register cell associated with the Boundary-Scan architecture.

FIG. 5 is a schematic diagram showing an instruction register cell 500 for storing one instruction bit in the instruction register. Instruction register cell 500 includes a multiplexer (MUX) 510, a shift register flip-flop 520 and a parallel latch 530. The selected data is transmitted to shift register MUX 510, which transmits either design specific DATA (optional) or instruction data shifted from a previous cell of the instruction register in accordance with a SHIFT-IR control signal generated by the TAP controller. Shift register flip-flop 520 stores the received data in response to a CLOCK IR control signal generated by the TAP controller, and transmits the stored data to a next cell in the instruction register (or to TDO if transmitted from the last cell) and to parallel latch 530. Parallel latch 530 either stores the data from shift register flip-flop 520, or resets in response to a RESET signal. After instruction data is shifted into all of the shift register flip-flops 520, the instruction data is parallel loaded into the parallel latches 530 of each cell in response to an UPDATE-IR signal from the TAP controller. Instruction data stored in each parallel latch 530 is transmitted with information from the other cells of instruction register 330 to instruction decode circuit 335 (see FIG. 3), which generates appropriate control signals that are used to control test data register circuit 340.

Referring again to FIG. 3, test data register circuit 340 receives the TDI input signal, and includes several data registers (or groups of registers) that are connected in parallel. These data registers include a bypass register 342, a series of Boundary-Scan registers (BSRs) 343, a device ID register 344, a user-assigned ID register 345 and an ISP configuration register 346. An output multiplexer (MUX) 348 that connects a selected one of the data registers to TDO during data shifting operations.

Bypass register 342 is a single stage shift register that provides a minimum length serial path for the test data shifting through the PLD to, for example, another IC on the PCB (both not shown) of an electronic system including the PLD.

Figure 6:
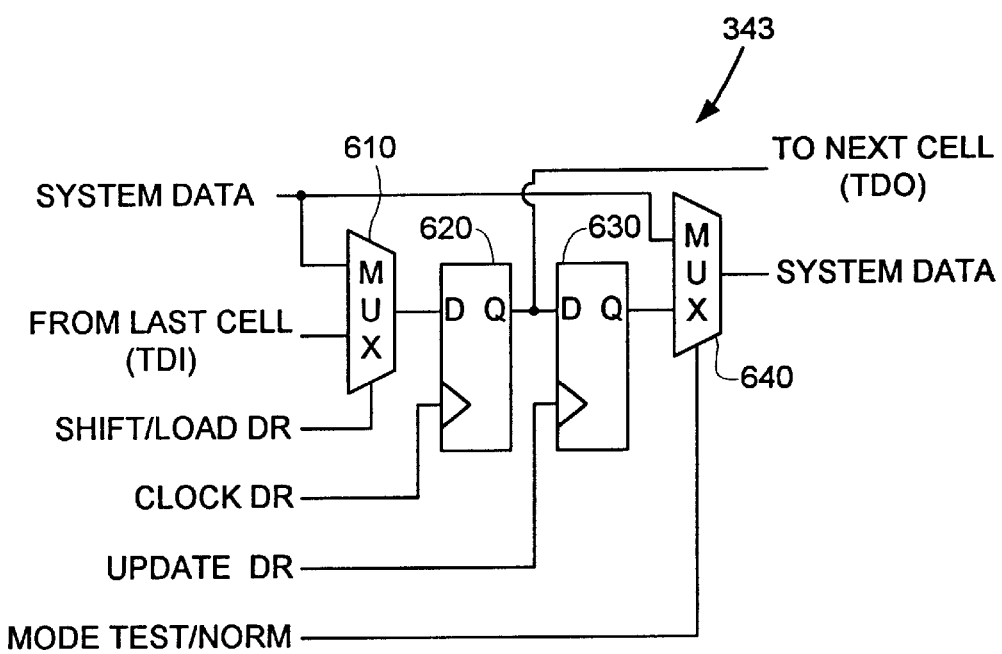
FIG. 6 is a simplified schematic diagram showing a data register cell associated with the Boundary-Scan architecture.

FIG. 6 is a schematic diagram showing a BSR cell 343 for storing one data bit used during BST procedures. Each BSR cell 343 includes an input multiplexer (MUX) 610, a shift register flip-flop 620, a parallel latch 630 and an output MUX 640. Input MUX 610 is controlled by a SHIFT/LOAD-DR control signal to either load SYSTEM DATA or shift TDI data from a previous BSR cell. The selected data is transmitted to shift register flip-flop 620 that stores the received data in response to a CLOCK DR control signal generated by the TAP controller. Shift register flip-flop 620 transmits the stored data either to a next BSR cell in the test data register circuit (or to TDO if transmitted from the last cell) and to parallel latch 630. Parallel latch 630 stores the data from shift register flip-flop 620 in response to an UPDATE-DR control signal from the TAP controller, and transmits this data to output MUX 640. Output MUX 640 is controlled by a MODE TEST/NORM control signal from the instruction register to either transmit SYSTEM data (during normal operation) or the contents of parallel latch 640 (during BST procedures). The signal from output MUX 640 is either transmitted to the core logic (when BSR cell 343 is associated with an input pin) or to the output pin of the PLD.

Referring again to FIG. 3, device ID register 344 and user-assigned ID register 345 provide binary information regarding the manufacturer, part number, version number and any user-assigned information used to identify the a PLD within a system. These registers are important for verifying correct installation/replacement of the PLD, and are used, for example, to identify the PLD during ISP.

ISP configuration register 346 allow serial shifting of ISP data using the TDI/TDO line, and parallel shifting of this data into the configuration memory of the PLD. Each ISP configuration register 346 is constructed similar to instruction register cell 500 (see FIG. 5).

The data signals output from instruction register 330 and test data register circuit 340 are transmitted to output MUX 350, which is controlled by a SELECT SIGNAL generated by TAP controller 320. In this way TAP controller 320 controls the transmission of instruction data or test data on the TDI/TDO line. The selected data is transmitted through output flip-flop 360 and tri-state buffer 370 to the TDO connector in TAP 310.

Boundary-Scan Test Method

Figure 7:
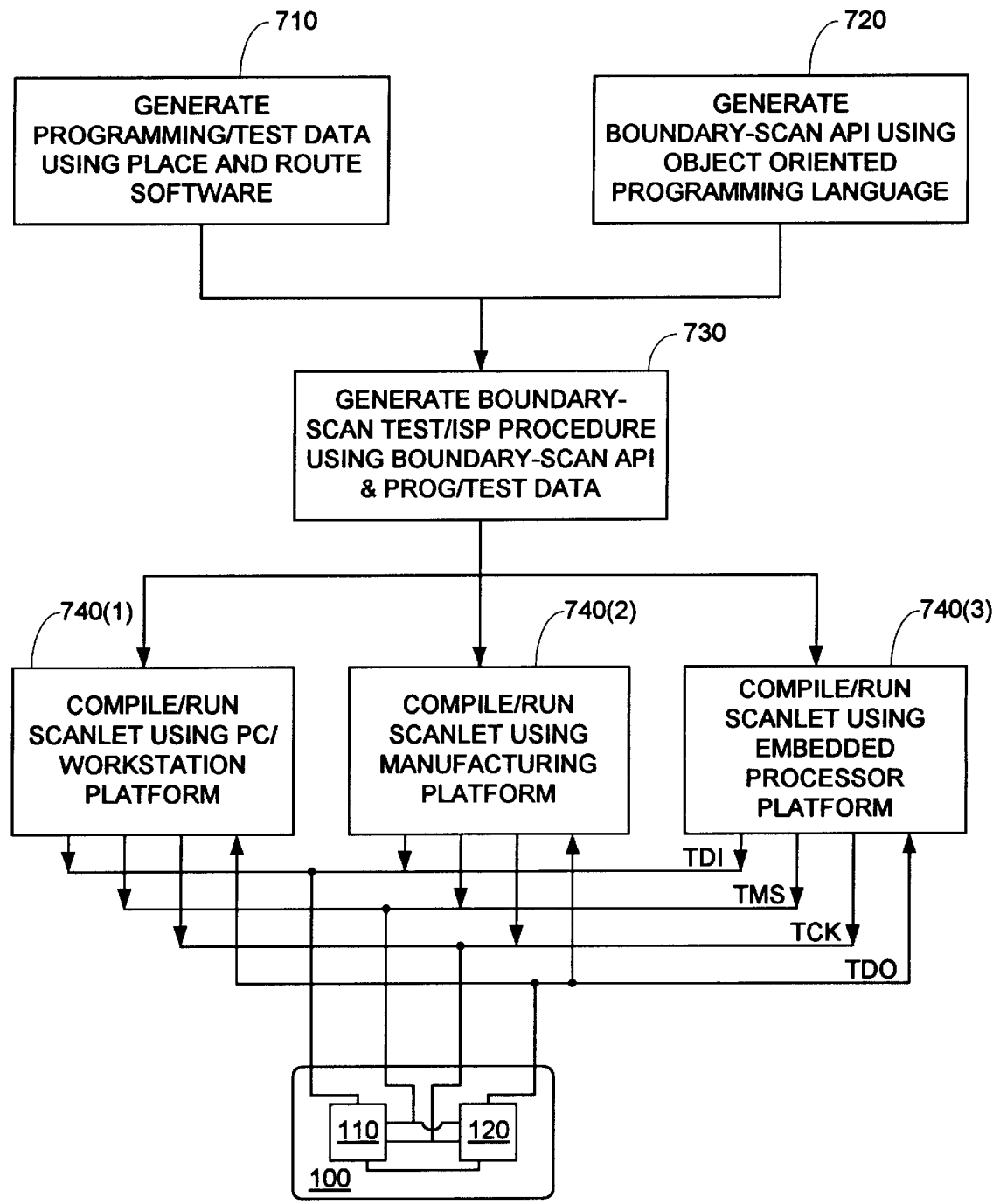
FIG. 7 is a flow diagram showing the method associated with the present invention.

FIG. 7 is a diagram illustrating the basic steps performed in association with an embodiment of the present invention. The initial steps of the method include the generation of ISP programming data and/or test data (Step 710) and the generation of an application procedural interface (API) that defines Boundary-Scan Test and ISP procedures using a platform-independent, object-oriented programming language (Step 720). The order in which Steps 710 and 720 are executed is not important to the present invention. After BST/ISP data is generated and a Boundary-Scan API is generated, BST procedures are generated using the Boundary-Scan Test API and the BST/ISP data (Step 730). Finally, the BST procedures are compiled and run using one of several hardware platforms; e.g., a personal computer (PC)/workstation platform (Step 740(1)), a high-speed manufacturing platform (Step 740(2)), or an embedded processor platform (Step 740(3)). The signals generated by any of these hardware platforms are then transmitted to ISP compliant PLD (or other IEEE Standard 1149.1 compliant IC) 110 or 120 utilized in a system including PCB 100 (FIG. 1).

Generation of BST/ISP data (Step 710) is performed using, for example, the place-and-route software typically provided by a PLD manufacturer (such as Xilinx, Inc. of San Jose, Calif.) or a third party programming software provider (such as Data I/O of Redmond, Wash.). Methods utilized to generate such BST/ISP data are well known to those of ordinary skill in the art. For example, the generation of bitmaps (data arrays) for configuring a target PLD using place-and-route software is well known. Because the present invention is directed to methods for transmitting this data to the target PLD during BST procedures, and not to the actual generation of this data, further discussion of these data generation methods is omitted for brevity.

Table 1 (below) provides a partial listing of possible hardware platforms from which a single PLD or IC may be programmed/tested to implement the BST/ISP data generated in Step 710. This partial listing presents an obvious problem. A programming algorithm for performing BST procedures directed to a target PLD/IC is relatively easily described. However, if the programming algorithm is written for a particular platform listed in Table 1, it typically must be reformulated before implementation in another platform. This is a particular problem to the development of ISP data for PLDs because the ISP data is typically developed using a first (prototyping) platform, programmed into the PLD using a second (manufacturing) platform, and in-field tested/reprogrammed using a third (e.g., embedded processor) platform.

TABLE 1

PARTIAL LISTING OF BOUNDARY-SCAN HARDWARE PLATFORMS/MANUFACTURERS

| WORKSTATIONS | | PERSONAL COMPUTERS | |
|---|---|---|---|
| 1. | Sun Microsystems | 1. | IBM (& compatibles) |
| 2. | Hewlett Packard | 2. | NEC |
| 3. | Digital Equipment Corp. | EMBEDDED CONTROLLERS | |
| SPECIAL PURPOSE PROGRAMMERS | | 1. | 8051 |
| | | 2. | 80x86 |
| 1. | Data I/O | 3. | 68000 |
| 2. | BP Microsystems | 4. | Sparc |
| SPECIAL PURPOSE DEVELOPMENT HARDWARE AND SOFTWARE | | 5. | Pentium |
| | | AUTOMATIC TEST EQUIPMENT | |
| 1. | Asset InterTech | | |
| 2. | JTAG Technologies | 1. | Hewlett Packard |
| 3. | Goepel | 2. | Teradyne |
| 4. | Intellitech | 3. | GenRad |
| 5. | Corelis | | |

In accordance with an embodiment of the present invention, the Boundary-Scan Test API (Step 720) is generated using the Java programming language developed by Sun Microsystems, Inc. of Palo Alto, Calif. The Java language Boundary-Scan Test API disclosed below in accordance with the present invention is referred to herein as the "XJScan API". Because Java is platform independent and object-oriented, the XJScan API facilitates the generation of BST procedures that can be compiled on any hardware platform implementing Java Virtual Machine 260 (see FIG. 2). In addition, these procedures can be utilized to program/test an ISP compliant PLD (or IEEE Standard 1149.1 compliant IC) using any hardware platform including a suitable native interface 270 and interface port 290 (see FIG. 2).

In accordance with an aspect of the present invention, in order to be truly platform independent, the XJScan API is constructed utilizing basic class structures that can be implemented in all flavors (versions) of the Java language. These various flavors of the Java language are directed to the various hardware platforms, and include command structures whose complexity is varied in accordance with the resources available on the target hardware platform. For example, Enterprise Java is a flavor of the Java language directed to highly sophisticated hardware platforms and requires approximately 3 Mbytes of memory. Personal Java is a relatively less sophisticated Java flavor that is directed to hand held computers and other smaller devices, and requires approximately 2 Mbytes of memory. Embedded Java is an even less sophisticated Java flavor directed to complex embedded control systems, and requires approximately 1 Mbyte of memory. At the present time, the least sophisticated Java flavor is JavaCard, which was generated for "smart card" products operating on 8-bit microprocessors that require only 10 Kbytes of memory. The difference between the command structures recognized by Enterprise Java and JavaCard are quite significant. As discussed in further detail below, in order to facilitate the development of BST procedures that can be implemented on any platform, the XJScan API is constructed using command structures that can be implemented using the most basic flavor of Java (i.e., JavaCard).

Once the Boundary-Scan API is developed (e.g., the XJScan API discussed below), the generation of Boundary-Scan Test/ISP procedures (Step 730) is performed using platform independent instructions. Because the Boundary-Scan API defines, for example, the Boundary-Scan state machine as an object, these instructions are greatly simplified because the specific steps required to perform procedures (e.g., shifting from one state to another) are defined in the Boundary-Scan API. For example, a user need only enter an instruction such as "move from state A to state B" instead of "cause TMS to generate x high pulses", thereby avoiding a significant source of programming error. This also reduces the risk of inadvertently causing damage to the system by transitioning to unexpected or inappropriate states of the Boundary-Scan state machine.

The above benefits and features of the present invention are described in additional detail in the following specific embodiments and examples.

XJScan (Boundary-Scan Test) API

The XJScan API provides a set of Java language methods (procedures) that facilitate access to the Boundary-Scan state machine resident on IEEE Standard 1149.1 compliant devices. Given the operation of the Boundary-Scan state machine, the operations supported by the XJScan API are easily explained and enumerated below. These operations are most logically presented in terms of objects and associated methods to follow the Java object-oriented paradigm.

In accordance with an embodiment of the present invention, the XJScan API is based on a subset of the Java language that provides the basic functions required for BST procedures. For brevity, the required subset is defined in the following paragraphs by comparison to the JavaCard flavor of the Java language (available from Sun Microsystems, Inc.).

The JavaCard flavor provides a close match to the Java language subset required for developing the XJScan API and associated BST procedures. The JavaCard flavor provides appropriate functionality and a sufficiently small footprint (less than 10 Kbytes) that is suitable for the most heavily constrained environment (i.e., an 8 bit embedded processor) upon which the XJScan API is likely to be used. Therefore, JavaCard provides a suitable starting point for defining the Java language subset associated with the XJScan API. However, several modifications to JavaCard are required.

The following modifications to JavaCard are required in order to implement the XJScan API. First, the maximum supported array size must be increased to 32 bits of addressing (currently JavaCard only addresses 11 bits). Second, the maximum field data should be increased to 1024 bytes (currently JavaCard only allows 256 bytes). Third, several logical and bitwise operators should be supported. Examples of these operators are listed in Table 2, below.

TABLE 2

Operators Required for XJScan API

I. Logic Operators

| | |
|---|---|
| 1. Unary inversion | 7. Unary Negation |
| 2. Multiplication | 8. Left Shift |
| 3. Division | 9. Right Shift |
| 4. Modulo | 10. Bitwise AND |
| 5. Addition | 11. Bitwise OR |
| 6. Subtraction | 12. Bitwise XOR |

II. Mathematical Operations

1. ABS() - absolute value
2. CEIL() - least integer less than

TABLE 2-continued

Operators Required for XJScan API

3. FLOOR() - greatest integer less than
4. LOG2() - base 2 logarithm
5. SQRT() - square root In addition to the basic functions needed to operate the Boundary-Scan architecture, the XJScan API is provided with an interface mechanism that is appropriate for ISP operations. Because a large amount of data is typically transmitted during an ISP operation, the XJScan API includes an XJScanIfCls object (discussed below) for handling data compression and decompression. Recognizing that different data types utilize some compression/decompression algorithms better than others, this object allows a user to select the most efficient algorithm. In an alternative embodiment, the XJScan API may provide a suitable algorithm.

Further, because the Boundary-Scan Test signals may be transmitted over a wide range of output devices (e.g., processor pins, PC parallel ports, serial port, USB, proprietary hardware port), the XJScan API includes a well defined native interface allowing communication through any of these devices.

Figure 8:
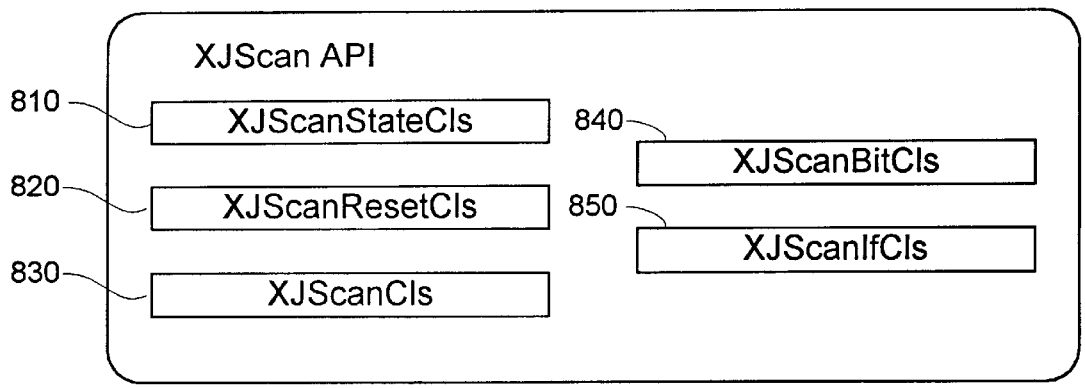
FIG. 8 is a block diagram representing the components of a Boundary-Scan API in accordance with the present invention.

FIG. 8 is a graphical representation of the component parts (objects) associated with the XJScan API in accordance with an embodiment of the present invention. In particular, the XJScan API includes a XJScanStateCls object 810, a XJScanResetCls object 820, a XJScanCls object 830, a XJScanBitCls object 840 and a XJScanIfCls object 850. Additional objects not discussed below may also be incorporated into the XJScan API, such as a class directed to security operations.

A. XJScanStateCls

The XJScanStateCls object defines the sixteen states of the Boundary-Scan TAP-Controller state machine. The XJScanStateCls object is used to describe the allowable state machine states. It is passed as a parameter to other methods to provide a standard way of describing state information.

A Java language embodiment of the XJScanStateCls object is provided below in Table 3.

TABLE 3

Java language embodiment of XJScanStateCls

```
static final byte TEST_LOGIC_RESET = 0;
static final byte RUN-TEST-IDLE = 1;
static final byte SELECT-DR-SCAN =2;
static final byte SELECT-IR-SCAN 3; ]
static final byte CAPTURE-DR = 4;
static final byte CAPTURE-IR = 5;
static final byte SHIFT-DR = 6;
static final byte SHIFT-IR = 7;
static final byte EXIT 1_DR = 8;
static final byte EXIT1 -IR = 9;
static final byte PAUSE_DR 10;
static final byte PAUSE-IR 11;
static final byte EXIT2_DR 12;
static final byte EXIT2-IR = 13;
static final byte UPDATE-DR = 14;
static final byte UPDATE-IR = 15;
private byte theState;
XJScanStateCls () {
theState = RUN_TEST_IDLE;
}
XJScanStateCls ( byte aState ) {
theState = aState;
}
```

TABLE 3-continued

Java language embodiment of XJScanStateCls

```
public void SetState ( byte aState ) {
theState = aState;
}
public byte GetState () {
return ( theState );
}
```

B. XJScanResetCls

The XJScanResetCls object is used to describe the reset technique used in a particular BST procedure (i.e., asynchronous reset using the optional TRST signal, if available, or synchronous reset using the TMS signal). This object is passed to other methods as a parameter to effect the actual reset function. It is defined so as to provide a standard way to describe reset techniques.

A Java language embodiment of the XJScanResetCls object is provided below in Table 4.

TABLE 4

Java language embodiment of XJScanResetCls

```
static final byte TRST_RESET = 2;
static final byte TMS_RESET = 1;
private byte theState;
XJScanResetCls () {
theState = TMS_RESET;
}
XJScanResetCls ( byte aState) {
theState = aState;
}
public void SetState (byte aState) {
theState = aState;
}
public byte GetState () {
return (theState);
}
```

C. XJScanCls

The XJScanCls object is the core class of the XJScan API, and describes the key Boundary-Scan functional methods typically utilized in Boundary-Scan Testing procedures.

Figure 9:
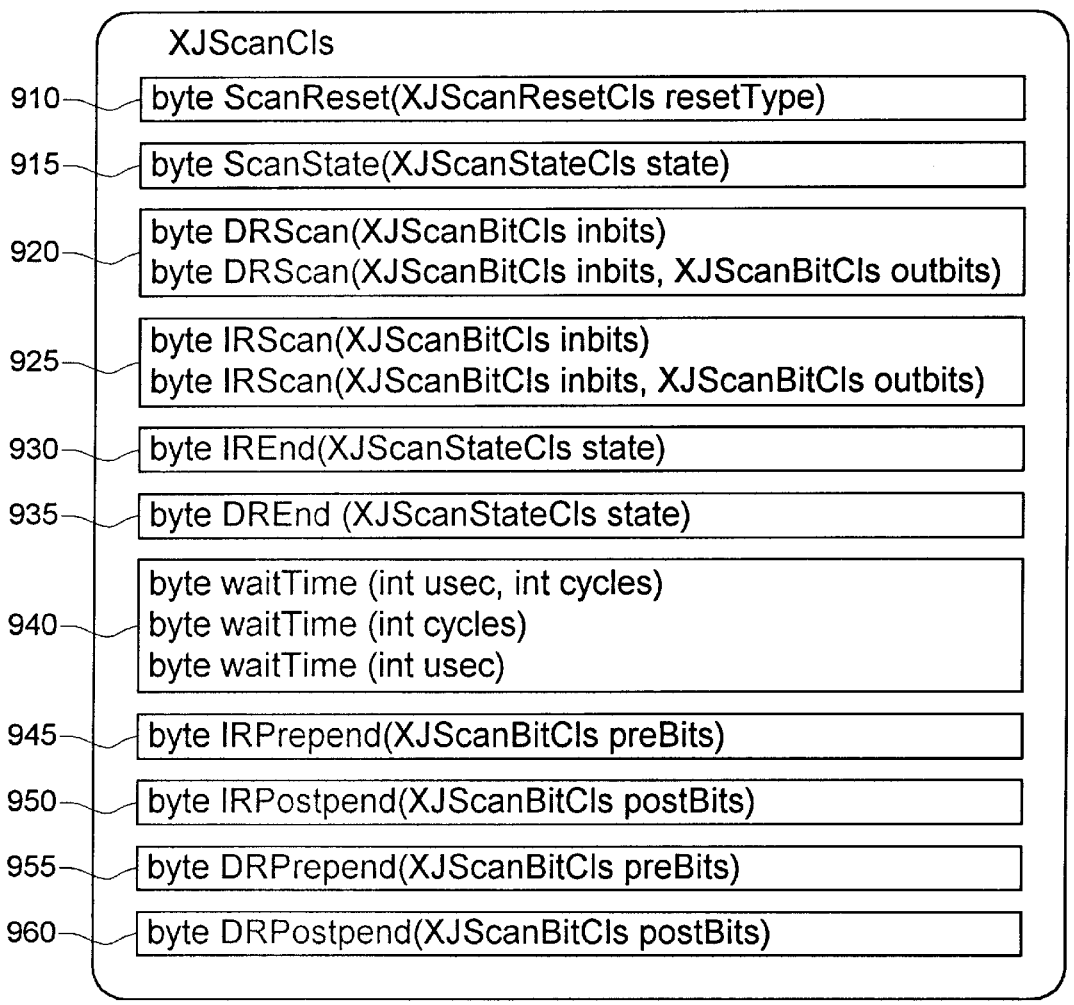
FIG. 9 is a block diagram representing the components of a first object of the Boundary-Scan API.

FIG. 9 is a graphical representation showing the methods associated with XJScanCls, including all Java language parameters associated with each method. These methods include ScanReset 910, ScanState 915, DRScan 920, IRScan 925, IREnd 930, DREnd 935, waitTime 940, IRPrepend 945, IRPostpend 950, DRPrepend 955 and DRPostpend 960. These methods are described in additional detail below. Additional methods may be defined for XJScanCls, but it is believed that the methods listed in FIG. 9 form a core minimum group of required methods. Note that each method returns a status byte where, in one embodiment, zero is success and any non-zero status is failure.

The ScanReset method 910 executes a Boundary-Scan architecture reset in accordance with a designated reset type (synchronous <TMS> or asynchronous <TRST>). When synchronous reset is designated, the reset instruction is executed by holding TMS at logic '1' and cycling TCK five times. Alternately, when asynchronous reset is designated, the reset is executed by holding TRST low (if the optional TRST signal is available). If an asynchronous reset is specified and TRST is not available, a synchronous reset is executed. The ScanReset method 910 is used to initialize the Boundary-Scan state machine and to effect system error recovery.

The ScanState method 915 transitions the TAP-controller state machine of the target PLD to a specified state. As discussed above, all valid states are identified in the XJScanStateCls object, and the actual TMS signal pattern required to move the state machine to the designated state is calculated by determining a difference between a current state and a target state of the state machine. Further restrictions on the ScanState method may require that the specified state should be a stable state (i.e., Run-Test/Idle, Test-Logic-Reset, Shift-DR, Shift-IR, Pause-IR, Pause-DR; see the state machine depicted in FIG. 4).

The DRScan method 920 generates TMS signals necessary to transition the TAP controller state machine into the Shift-DR state. In the "DRScan(XJScanBitCls inBits)" implementation, the DRScan method also drives TDI to shift designated bits (identified by "inBits") into selected data registers of the PLD. This implementation is used, for example, to load selected data registers with BST/ISP data prior to a BST procedure. In the "DRScan(XJScanBitCls inBits, XJScanBitCls outBits)" implementation, the DRScan captures bits ("outBits") that are stored in the data registers. This implementation is used, for example, to obtain test or identification information shifted out of selected data registers. Note that dummy or subsequently-used data bits ("inBits") must be shifted into the PLD in order to shift out the "outBits" data.

The IRScan method 925 generates TMS signals necessary to transition the TAP controller state machine into the Shift-IR state. In the "IRScan(XJScanBitCls inBits)" implementation, the IRScan method also drives TDI to shift designated bits (identified by "inBits") into the instruction registers of the PLD. This implementation is used, for example, to load selected instruction registers with BST/ISP instructions prior to a BST procedure. In the "IRScan (XJScanBitCls inBits, XJScanBitCls outBits)" implementation, the IRScan captures bits ("outBits") that are stored in the instruction registers. The IREnd method 930 indicates to which state the TAP controller should transition after executing any IRScan operations. The specified state should be a stable state, such as Pause-IR or Run-Test/Idle.

The DREnd method 935 indicates to which state the TAP controller should transition after executing any DRScan operations. The specified state should be a stable state, such as Pause-IR or Run-Test/Idle.

The WaitTime or WaitTCK method 940 generates a TMS signal necessary to cause the TAP controller state machine to pause for a designated number of microseconds (usec), a designated number of TMS cycles, or both in combination. This instruction causes the state machine to wait in its current state while, for example, test or programming operations are completed.

Because the PCB-level system typically comprises a Boundary-Scan chain composed of many IC devices serially connected in a daisy chain, the amount of data transmitted to the IC devices can be very large. The IRPrepend method 945, IRPostpend method 950, DRPrepend method 955 and DRPostpend method 960 are provided to help reduce the amount of data required to be specified for transmission through the Boundary-Scan chain when only one or a few of the devices are being targeted.

The IRPrepend method 945 specifies and stores a number of instruction data bits ("preBits") to be prepended (i.e., stored in the designated number of most significant bits of a chain of instruction register cells) by a set of IC devices in the Boundary-Scan chain during IRScan operations. The bits stored by the IRPrepend method 945 are automatically added to the bits applied by any subsequently issued IRScan operation.

Similar to the IRPrePend method, the IRPostpend method 950 specifies a number of instruction bits ("postBits") to be postpended (i.e., stored in the designated number of least significant bit instruction register cells) by a particular IC device in the Boundary-Scan chain during IRScan operations. The bits stored by the IRPostpend method 945 are automatically added to the bits applied by any subsequently issued IRScan operation. Once called, the particular IC devices maintain the IRPostpend operation until the method is canceled by transmitting postpended data composed, for example, of a NULL bit string.

Similar to the IRPrePend and IRPostpend methods, the DRPrePend method 955 and DRPostpend method 960 specify a number of instruction data bits ("preBits" and "postBits") to be prepended/postpended (i.e., stored in the designated number of most/least significant bit data registers) by a particular IC device in the Boundary-Scan chain during DRScan operations. The bits stored by the DRPrepend method 955 and DRPostpend method 960 are automatically added to the bits applied by any subsequently issued DRScan operation. Once called, the particular IC devices maintain the DRPrepend/DRPostpend operation until the method is canceled by transmitting prepended/postpended data composed, for example, of a NULL bit string.

D. XJScanBitCls

The bitmap or file containing the programming or test data transmitted to the target PLD during the BST procedure, which is represented in ASCII, HEX or BINARY, can get overwhelmingly large. This is especially true if many devices are being programmed or tested in the same electronic system. The serial transmission speed of these large data files is greatly increased using a data compression algorithm. The data producer, however, best selects the actual compression algorithm used. By having data producers select the actual data compression algorithm, each data producer is able to select an appropriate data compression technique that provides optimal results for their type of data. This selection provides the additional advantage of not enforcing an algorithm that favors one style of data over another or delivers equally suboptimal results for all data.

Although the data producers select an optimal data compression algorithm, each XJScan applet (discussed below) is not required to provide its own decompression algorithm. Instead, the XJScan API accommodates the wide variety of algorithms by providing a standard data interface via the XJScanBitCls object and its associated methods.

Figure 10:
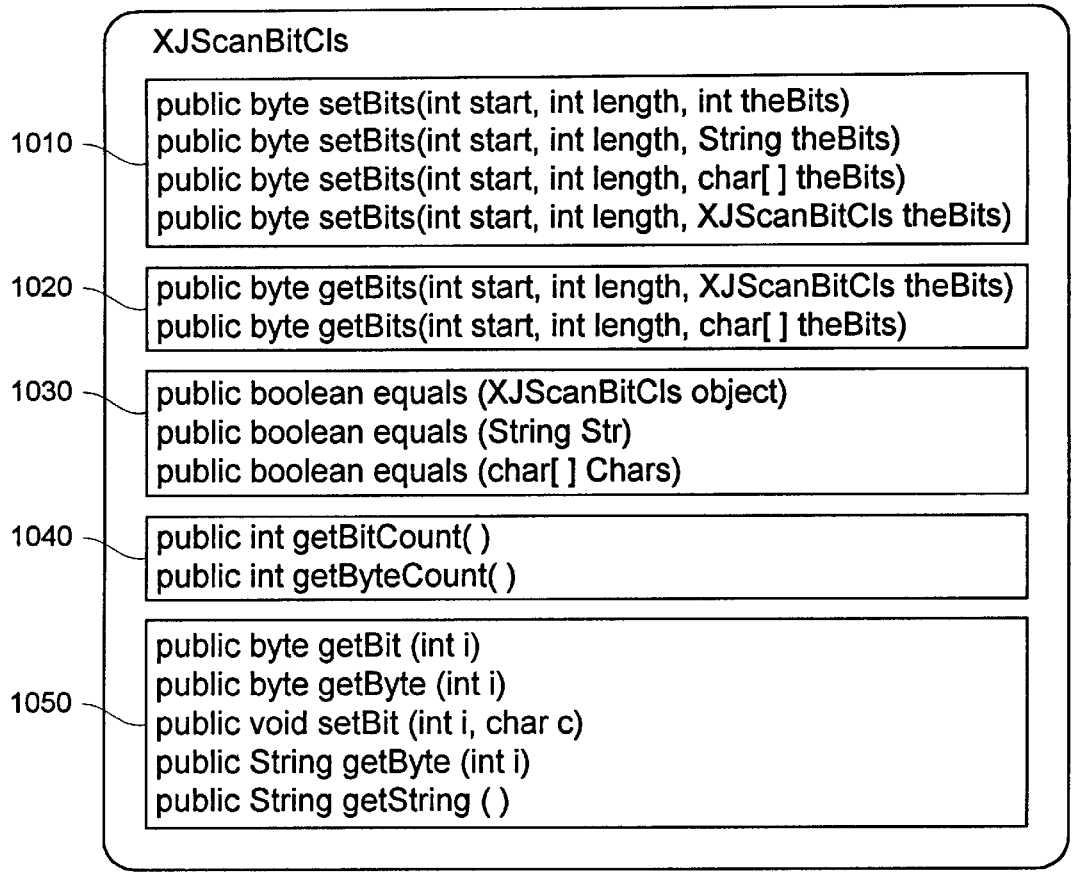
FIG. 10 is a block diagram representing the components of a second object of the Boundary-Scan API.

FIG. 10 is a graphical representation showing the methods associated with XJScanBitCls in accordance with an embodiment of the present invention. These methods include setBits 1010, getBits 1020, boolean equals 1030, getBit/ByteCount 1040 and get/setBit/Byte/String 1050. As mentioned above, the XJScanBitCls object defines methods for accessing compressed data. Each method of the XJScanBitCls object listed in FIG. 10 returns a byte indicating status. These methods are described in additional detail below.

The setBits method 1010 provides a variety of operational formats for converting a data/instruction file ("theBits") using a selected data compression algorithm. The various parameters of the operational formats shown in FIG. 10 facilitate conversion to a chosen storage format. The "start" parameter indicates an initial memory location for storing the delivered data ("theBits"). The "length" parameter indicates the amount of data that is being delivered. The setBits method 1010 is used to modify or store a specific sequence of bits. Typically, this method is used to set up the data to be shifted into the Boundary-Scan chain.

The getBits method 1020 provides operational formats for getting target data from the chosen storage format for the XJScanBitCls object. The "start" parameter indicates a memory location in which a first bit of the target data is stored. The "length" parameter indicates the amount of data that is being retrieved. The requested data is returned as "theBits". The getBits method 1020 is used to retrieve data shifted out of the Boundary-Scan chain for temporary storage before further processing.

The boolean Equals method 1030 provides a test for equality that is appropriate for a variety of data types (e.g., strings or character arrays). Typically, this method is used to test retrieved data against expected values.

The getBit/ByteCount method 1040 provides informational methods returning the amount of available data in either a number of bits or a number of bytes. Typically, this method is used to retrieve data characteristic information suitable to facilitate processing of data for test or programming. The getBit/Byte/String method 1050 provides a variety of access methods for getting (retrieving) specific bit information about the data stored in an object. Similar to the getBit/ByteCount method 1040, this method is used to retrieve data characteristic information suitable to facilitate processing of data for test or programming. The "public void setBit (int i, byte c)" operation is used to set bit position "i" with a logic value "c".

E. XJScanIfCls

Ultimately the TAP controller operations (described above) need to be applied to the system as electrical stimuli. Referring to FIG. 2, interface port 290 might include processor pins in an embedded processor, a PC parallel port, a workstation serial port, a computer USB, a FireWire port or a custom hardware proprietary port. The TAP controller operations must be converted (if necessary) and routed such that they are transmitted to the target system through any of these interface ports.

The classical manner to interface to a wide variety of disparate devices is to define a standard device interface and then supply drivers for each device as appropriate. With API's developed in the Java language, this interface is best implemented as a Java Native Interface (JNI). In the present embodiment, all of the native calls are encapsulated in the XJScanIfCls object. The XJScanIfCls object allows users to run their procedures on, for example, embedded processor platforms where actual pins of the microprocessor are used to generate the TAP signals, a PC where a parallel port is used to generate the TAP signals, or on automatic test equipment where complex proprietary hardware is used to drive the TAP pins.

Figure 11:
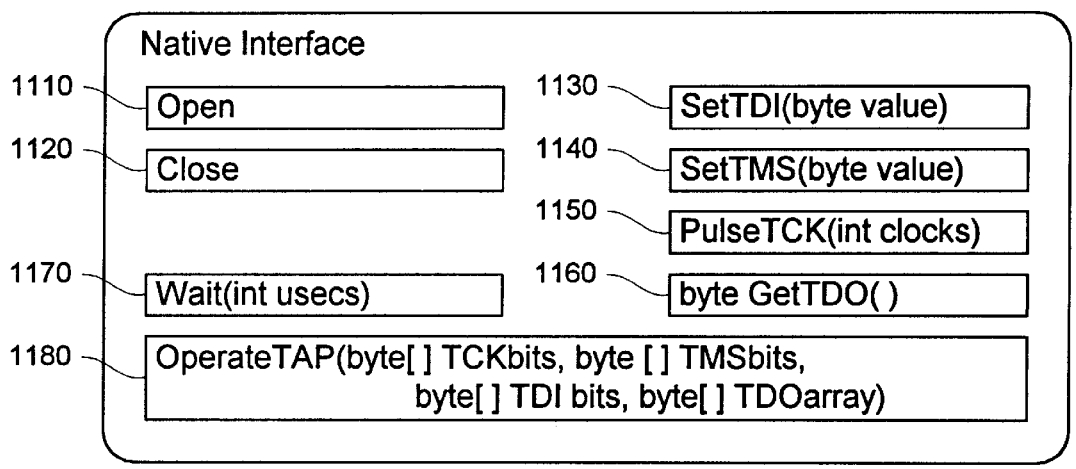
FIG. 11 is a block diagram representing the components of a native interface utilized by the Boundary-Scan API.

FIG. 11 is a graphical representation showing the Java Native Interface methods associated with the XJScanIfCls object in accordance with an embodiment of the present invention. These methods include Open 1110, Close 1120, SetTDI 1130, SetTMS 1140, PulseTCK 1150, GetTDO 1160, Wait 1170 and OperateTAP 1180. These methods are described in additional detail below.

The Open (1110) and Close (1120) methods define routines that respectively initialize and terminate the interface port connection. These methods are implemented typically in "C", "C++" or assembly language code, and compiled to run on the target platform only.

The SetTDI method 1130, SetTMS method 1140, PulseTCK method 1150 and GetTDO method 1160 define routines that respectively access the TDI, TMS, TCK and TDO connectors of the TAP. These methods are implemented typically in "C", "C++" or assembly language code, and compiled to run on the target platform only. For example, if the target platform is a PC and the hardware interface is the PC's parallel port, then the native code will map operations of each of the TAP signals to the necessary operations to stimulate the parallel port pins that are connected to the system TAP. In addition, the PulseTCK method is called to provide atomic TCK control for state transitions or for wait methods that request a specific number of TCK pulses.

The Wait method 1170 implements a timer. Since this capability is usually hardware dependent, it needs to be implemented at the native interface level. Such timers are typically available as part of the operating system or implemented using well-known software timing algorithms.

The levels of control described in SetTDI method 1130, SetTMS method 1140, PulseTCK method 1150 and GetTDO method 1160 are low level and typically result in slower overall execution when used to describe all TAP operations. The OperateTAP method 1180 is provided to provide more efficient scan operations. This method specifies a sequence of values to be applied to the transmission medium. Specifically, the TCKbits variable is a "1" when TCK should pulse, the TMSbits variable specifies the exact value of TMS to be applied concurrent with the TCK specified at that location, and the TDIbits variable similarly describes the TDI value. The TDOarray is an array for collecting TDO values that is returned to the calling routine. If the TDOarray is NULL, then no TDO values are returned. For efficiency all eight bits of the byte should be filled with data.

Boundary-Scan Test Procedures Using XJScan API

Referring again to FIG. 7, once the BST/ISP data is generated (Step 710) and the XJScan API is generated (Step 720) as discussed above, BST and ISP procedures are generated for IEEE Standard 1149.1 compliant PLDs that can be implemented on any platform, thereby avoiding costly translation of the instructions into several languages and the potential problems associated with mistranslation. In accordance with a first embodiment of the present invention, BST and ISP procedures are generated as XJScan applets (referred to herein as a "Scanlets") that are written using the objects and methods established in the XJScan API. In accordance with a second embodiment, a single object can be created, for example, by a device manufacturer that provides all device functions (e.g., BST procedures and ISP procedures) that are directed to a specific PLD or group of PLDs. Both of these BST procedure generation methods are described in detail below.

A. Scanlet

In a first embodiment of the present invention, BST and ISP procedures are generated as Scanlets that are written in Java language source code using the methods defined in the XJScanBitCls, XjScanResetCls, XJScanStateCls and XJScanCls objects of the XJScan API (described above). One proficient in writing Java language source code and familiar with BST/ISP procedures is able to generate Scanlets that are platform independent. That is, each Scanlet does not include a direct call to the native interface layer. Instead, those native calls will be restricted to the XJScanCls object. This frees the user to concentrate on the particular BST/ISP procedure to be performed, not on the specific hardware platform utilized to perform the BST/ISP procedure.

The BST/ISP data required by each Scanlet can either be provided as static data within the Scanlet or as a parameter passed to the Scanlet. In one embodiment, the data and algorithm are separated to facilitate easier updating of both data and algorithm.

Typically, each Scanlet is generated to perform user-specified operations. Multiple Scanlets can be collected together to perform a series of operations requested by the user. These Scanlets can be integrated into a single master Scanlet that executes the appropriate Scanlets in a user-specified order.

Master Scanlets can also be fed chain configuration information, thereby allowing Scanlets to be padded with the appropriate prepend and postpend information.

B. XJScanDeviceCls

In a second embodiment of the present invention, a single Java language object (referred to as the XJScanDeviceCls object) is generated with pre-defined methods (entry points) for performing BST and ISP procedures on a target device. In one embodiment, the XJScanDeviceCls object is instantiated by a master Scanlet that can be implemented on any platform, and the individual methods called interactively by a user when the master Scanlet is compiled and run on a selected platform. This refinement requires generating, instead of Java files that are executable, simple Java files that form the XJScanDeviceCls object.

Figure 12:
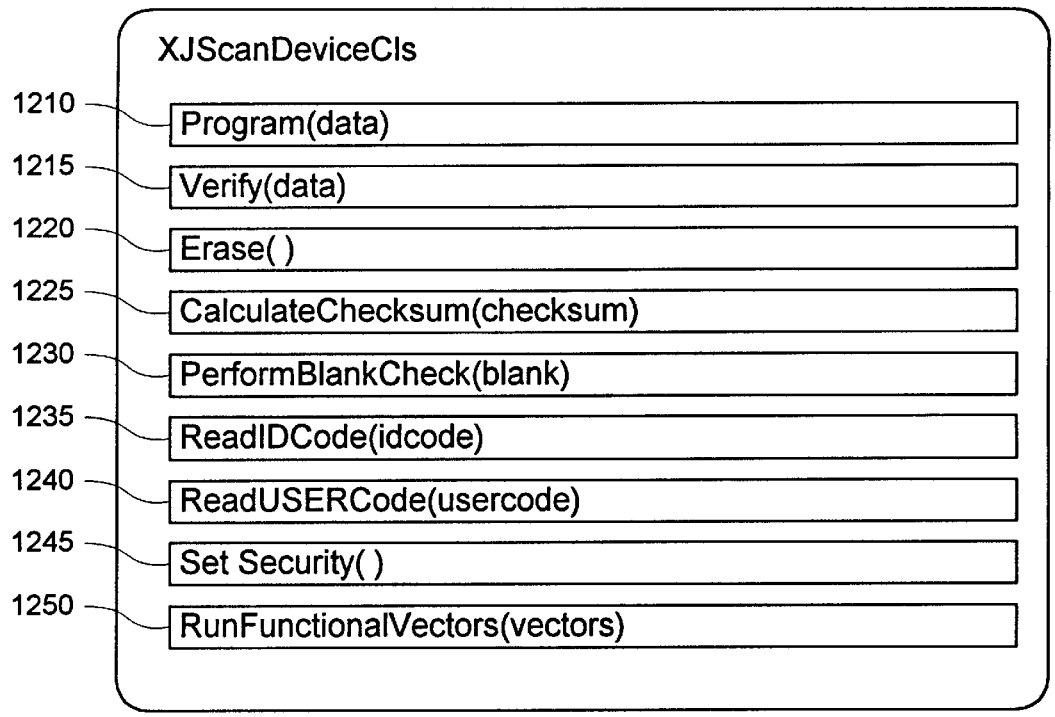
FIG. 12 is a block diagram representing the components of a third object the Boundary-Scan API.

FIG. 12 is a graphical representation showing the methods associated with the XJScanDeviceCls object in accordance with an embodiment of the present invention. These methods include Program 1210, Verify 1215, Erase 1220, CalculateChecksum 125, PerformBlankCheck 1230, ReadIDCode 1235, ReadUSERCode 1240, SetSecurity 1245 and RunFunctionalVectors 1250.

The Program method 1210 programs a device with the "data" specified by the user. The device is specified by the user who is familiar with the target device (e.g., PLD).

The Verify method 1215 reads the program memory of a target device and compares it against the expected values, then returns a status message confirming that the program memory read from the device equals the expected values The Erase method 1220 erases the program memory of the device by, for example, triggering an internal hardware-controlled operation that is provided on the device to erase the memory cells.

The CalculateCheksum method 1225 reads the target device program memory and calculates and returns a checksum. The checksum is used to verify programming data stored in the target device, as well as to provide a quick method of identifying the target device programming pattern.

The PerformBlankCheck method 1230 checks to see if a device is erased and returns an indication of the device disposition. In one embodiment, this method reads the data from the program data registers, then checks for bits that are logic '1' (indicating that an erase procedure has not been successfully implemented).

The ReadIDCODE method 1235 and ReadUSERCode method 1240 read and return the Boundary-Scan hard-coded identification register and user-programmed identification register, respectively.

The SetSecurity method 1245 sets device security to disable all further read or program operations from the designated device.

The RunFunctionalVectors method 1250 uses the 1149.1 INTEST instruction to run functional vectors on the designated device and indicates their success.

In addition to the methods set forth above, there could also be many other entry points. Each XJScanDeviceCls method can also return the set of entry points available to the application that calls the method. The calling application can then use the entry points that it understands.

Each XJScanDeviceCls method will also have to supply a return status and, in some cases, a return value. As with all other methods, the return status is a byte and, in one embodiment, a non-zero value indicates failure.

Additional Considerations

In order to support generalized Boundary-Scan Test at least two further instruction calls must be supported by the XJScan API. These instructions would be useful only when the target system has access to actual functional pins in the system under test. Some mechanism would need to be added to the XJScan API to facilitate identification of such systems.

Figure 13:
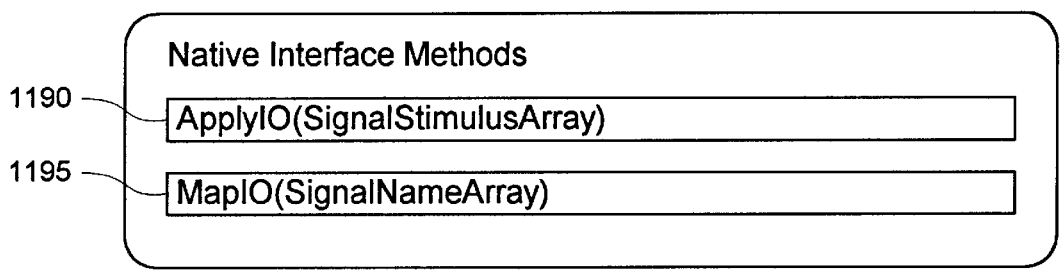
FIG. 13 is a block diagram representing alternative components associated with a Boundary-Scan Test procedure.

FIG. 13 is a diagram a graphical representation showing two optional instruction calls that are added to the Native Interface Methods object in accordance with another embodiment of the present invention. These additional instruction calls include ApplyIO 1190 and MapIO 1195.

The ApplyIO instruction 1190 indicates values to be applied to functional pins in the system under test. In addition, output values are sampled and returned.

The MapIO instruction 1195 precedes all calls to ApplyIO. It defines (by position) the signal name associated with the values specified in ApplyIO. For example, a position 'i' in the SignalNameArray array maps to a corresponding position 'i' in the SignalStimulusArray array.

If the ApplyIO and MapIO calls are used, then some corresponding Java Native Interface calls are required to apply the output stimulus. The mapping of signal names to signal drivers also must be accomplished. For example, the user can indicate that they want to perform a MapIO instruction on a signal designated "FOO". The Java Native Interface layer must know that it has access to the signal named "FOO" and, if it does, how to route a logic 1 or logic 0 to the signal.

The use of the native interface in the XJScan API allows for the incorporation of value added to independent vendor implementations. This is true because all data must transit through the Java Native Interface layer of the XJScan API. This makes the native interface an appropriate place to include hooks for system debug including breakpoints, data collection for display and single step operations. This also allows the development of applications to collect and analyze data as it passes through the native layer and facilitate detailed user interaction with the system.

For that same reason, the JNI layer can be used to collect data and store it to effect concurrent operation of multiple independent devices in a boundary-scan chain.

Users may choose to generate XJScan applets that incorporate all devices in a chain (so as to facilitate concurrent access to the devices). Alternatively, users may choose to generate applets wherein each applet describes the operation of a single device. In the latter case, multiple-applets could be run in multithreaded mode to effect quasi-concurrent access.

The XJScan API is scalable to Embedded Java, Personal Java and Enterprise Java, thereby allowing users to migrate upward to more complex and fully featured systems without changing the XJScan code in their scanlets.

In addition, users of the XJScan API gain immediate access to development tools already available for Java. This further enhances the XJScan API as an attractive method for performing BST procedures.

Java's communication layers afford instant application of the XJScan API to remotely update applications. This remote update could be accomplished via the internet or any other suitable communications medium by having the applet query a remote data base and load new programming data if it differs from the data currently stored by the applet.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, the methods described with respect to the present invention may be written in any platform independent, object-oriented programming language other than Java.

What is claimed is:

1. A method for performing Boundary-Scan Test procedures on an integrated circuit device including a Boundary-Scan architecture, the method comprising the steps of:

generating a Boundary-Scan Test application procedural interface (BST API) including one or more objects that define the Boundary-Scan architecture and a plurality of source code commands using an object oriented, platform independent programming language, wherein the objects and source code commands are defined using basic command structures of the object oriented, platform independent programming language such that the BST API operates on a plurality of hardware platforms;

generating a Boundary-Scan Test procedure including selected source code commands defined in the BST API, wherein the selected source code commands of the Boundary-Scan Test procedure are executable on any of the plurality of hardware platforms; and performing the Boundary-Scan Test procedures on the integrated circuit device using a selected one of the plurality of hardware platforms.

2. The method of claim 1, wherein the object oriented, platform independent programming language is Java.

3. The method of claim 2, wherein the step of generating the Boundary-Scan Test procedure comprises forming a Java language applet including the selected source code commands.

4. The method of claim 2, wherein the step of generating the Boundary-Scan Test procedure comprises generating an object with pre-defined methods for performing procedures on the integrated circuit device that can be implemented on any platform, and then forming a master applet instantiating the object such that selected ones of the pre-defined methods can be interactively called by a user.

5. The method according to claim 1, wherein the step of generating the BST API further comprises a second plurality of source code commands using the object oriented, platform independent programming language that define in-system programming (ISP) procedures.

6. The method according to claim 1, wherein the BST API comprises an object defining states associated with a state machine of a Boundary-Scan TAP-Controller of the integrated circuit device.

7. The method according to claim 1, wherein the BST API comprises an object including a method for transitioning the Boundary-Scan TAP-controller state machine of the integrated circuit device to a specified state.

8. The method according to claim 1, wherein the BST API comprises an object including a standard data interface.

9. The method according to claim 1, wherein the BST API comprises an object including all native interface calls, and wherein the step of generating a Boundary-Scan Test procedure includes selected source code commands that omit the native interface calls.

* * * * *